United States Patent
See et al.

(10) Patent No.: US 7,167,686 B2
(45) Date of Patent: Jan. 23, 2007

(54) WIRELESS COMMUNICATIONS TRANSCEIVER: TRANSMITTER USING A HARMONIC REJECTION MIXER AND AN RF OUTPUT OFFSET PHASE-LOCKED LOOP IN A TWO-STEP UP-CONVERSION ARCHITECTURE AND RECEIVER USING DIRECT CONVERSION ARCHITECTURE

(75) Inventors: Puay-Hoe Andrew See, San Diego, CA (US); James Jaffee, Solana Beach, CA (US); Steven Mollenkopf, San Diego, CA (US); Sandor Szabo, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 311 days.

(21) Appl. No.: 10/350,407

(22) Filed: Jan. 24, 2003

(65) Prior Publication Data

US 2004/0005869 A1  Jan. 8, 2004

Related U.S. Application Data

(60) Provisional application No. 60/351,869, filed on Jan. 25, 2002.

(51) Int. Cl.
*H04B 1/40* (2006.01)
(52) U.S. Cl. .................... 455/77; 455/120; 455/205
(58) Field of Classification Search ............ 455/114.2, 455/260, 63.1, 317–320, 324, 323, 313, 119, 455/112; 375/306, 308, 303, 298, 302; 327/113–119
See application file for complete search history.

(56) References Cited

U.S. PATENT DOCUMENTS 4,229,821 A   10/1980   De Jager et al.

(Continued)

FOREIGN PATENT DOCUMENTS

WO    0052840    9/2000

(Continued)

OTHER PUBLICATIONS

Weldon, J. et al. (Dec. 2001) A 1.75-GHz Highly Integrated Narrow-Band CMOS Transmitter With Harmonic-Rejection Mixers, IEEE, vol. 36, No. 12, pp. 2003-2015.

*Primary Examiner*—Quochien B. Vuong
*Assistant Examiner*—Christian A. Hannon
(74) *Attorney, Agent, or Firm*—Philip R. Wadsworth; Charles D. Brown; Kenyon S. Jenckes

(57) ABSTRACT

A wireless transceiver includes a transmitter having a harmonic rejection mixer and an RF output phase-locked loop in a two step up-conversion architecture, and a direct conversion receiver. The transmitter includes a local oscillator for producing a signal at a multiple of an intermediate frequency, a quadrature modulator harmonic rejection mixer responsive to the signal at the multiple of the intermediate frequency for modulating in-phase and quadrature-phase base-band signals to produce an intermediate frequency signal, a filter responsive to the intermediate frequency signal for producing a filtered intermediate frequency signal, and an RF output offset phase-locked loop responsive to the filtered intermediate frequency signal and the signal at the multiple of the intermediate frequency for producing an RF transmission signal. The harmonic rejection mixer reduces filtering requirements to facilitate a high level of circuit integration. The local oscillator may use a integer or fractional-N phase-locked loop.

38 Claims, 8 Drawing Sheets

U.S. PATENT DOCUMENTS

| | | | | |
|---|---|---|---|---|
| 4,360,788 A * | 11/1982 | Erps et al. | ............... | 331/1 A |
| 6,388,511 B1 * | 5/2002 | Kanao | ............... | 327/558 |
| 6,411,801 B1 * | 6/2002 | Kim et al. | ............... | 455/333 |
| 6,553,079 B1 * | 4/2003 | Piirainen | ............... | 375/269 |
| 6,574,462 B1 * | 6/2003 | Strange | ............... | 455/318 |
| 6,590,460 B1 * | 7/2003 | Tenten et al. | ............... | 331/74 |
| 6,658,237 B1 * | 12/2003 | Rozenblit et al. | ............... | 455/83 |
| 6,754,508 B1 * | 6/2004 | Pau | ............... | 455/552.1 |
| 6,766,178 B1 * | 7/2004 | Damgaard et al. | ............... | 455/552.1 |
| 6,791,422 B1 * | 9/2004 | Staszewski et al. | ............... | 331/36 C |
| 6,856,791 B1 * | 2/2005 | Klemmer | ............... | 455/76 |
| 6,868,261 B1 * | 3/2005 | Shi et al. | ............... | 455/114.2 |

FOREIGN PATENT DOCUMENTS

WO      0076060      12/2002

\* cited by examiner

WIRELESS COMMUNICATIONS TRANSCEIVER: TRANSMITTER USING A HARMONIC REJECTION MIXER AND AN RF OUTPUT OFFSET PHASE-LOCKED LOOP IN A TWO-STEP UP-CONVERSION ARCHITECTURE AND RECEIVER USING DIRECT CONVERSION ARCHITECTURE

RELATED APPLICATIONS

This Application claims priority to U.S. Provisional Application Ser. No. 60/351,869, filed on Jan. 25, 2002.

BACKGROUND

1. Field

The disclosed method and apparatus relates generally to wireless communications and more particularly to a wireless communications transceiver.

2. Description of the Related Art

Wireless communications devices are being manufactured in increasing numbers for widespread public use. Manufacturers are under increasing pressure to lower cost, and have responded by offering highly integrated transceiver circuits. There is a desire to minimize circuit complexity not only to reduce the size and therefore the cost of the integrated circuit chips, but also to reduce power consumption. Power consumption is especially important for small hand-held devices such as mobile phones. There is also a desire to provide highly integrated circuitry that is capable of operation over two or more frequency bands, such as the respective bands for EGSM (Global System for Mobile Communications), DCS (Digital Cellular Systems), and PCS (Personal Communications Service).

Wireless communications devices typically use digital phase modulation. EGSM, DCS, and PCS in particular may use a minimum frequency-shift keying modulation format having a substantially constant amplitude envelope. Typically the modulated RF (radio frequency) signal is produced from in-phase and quadrature-phase base-band signals. For example, to produce a substantially constant amplitude envelope, the in-phase and quadrature-phase base-band signals are band-limited binary data streams that are offset from each other in time by one-half of a bit period and that are amplitude modulated so that the sum of the squares of the in-phase amplitude and the quadrature-phase amplitude is constant. In practice, the desired in-phase and quadrature-phase base-band signals are digitally synthesized as a function of the data to be transmitted. A pair of digital-to-analog converters convert the digitally synthesized in-phase and quadrature-phase signals to respective analog signals for application to a quadrature modulator capable of producing a modulated RF signal.

Although a quadrature modulator may produce a modulated RF signal directly at the frequency to be transmitted, there are advantages to producing the modulated RF signal at a lower frequency for up-conversion to the frequency to be transmitted. Such a two-step up-conversion process permits the desired performance requirements of the quadrature modulator, such as the tolerable deviation from an ideal amplitude balance and quadrature-phase shift, to be more readily achieved at the lower frequency. For example, it is easy for integrated digital circuitry to produce quadrature-phase carriers at the lower frequency, and the quadrature modulator can be configured as a harmonic rejection mixer in order to reduce spurious effects of the digitally-produced quadrature-phase carriers.

A two-step up-conversion architecture for a wireless transmitter is shown in Kaufman et al. U.S. Pat. No. 6,240,142. The use of a harmonic rejection mixer in this architecture is shown in Weldon et al., "A 1.75 GHz Highly-Integrated Narrow Band CMOS Transmitter with Harmonic-Rejection Mixers," 2001 IEEE International Solid-State Circuits Conference, Feb. 6, 2001, pp. 160–161, 442. Although these circuits provide an improvement over a direct-conversion transmitter architecture for high levels of integration, there is still a need for decreasing circuit complexity in order to reduce power consumption for hand-held communications devices. The two-step up-conversion architecture of Kaufman et al. uses a multiplicity of high-frequency balanced modulators, including two balanced modulators operating at the RF transmission frequency. The balanced modulators consume a significant amount of power.

SUMMARY

The disclosed method and apparatus includes a transmitter circuit. The transmitter circuit includes a local oscillator for producing a signal at a multiple of an intermediate frequency, and a quadrature modulator harmonic rejection mixer responsive to the signal at the multiple of the intermediate frequency for modulating an in-phase base-band signal and a quadrature-phase base-band signal to produce an intermediate frequency signal. The transmitter circuit further includes a filter responsive to the intermediate frequency signal for producing a filtered intermediate frequency signal, and an RF output offset phase-locked loop responsive to the filtered intermediate frequency signal and responsive to the signal at the multiple of the intermediate frequency for producing an RF transmission signal.

In accordance with another embodiment, the transmitter circuit includes a local oscillator for producing a signal at a multiple of an intermediate frequency, and a quadrature modulator responsive to the signal at the multiple of the intermediate frequency for modulating an in-phase base-band signal and a quadrature-phase base-band signal for producing an intermediate frequency signal. The transmitter circuit further includes a filter responsive to the intermediate frequency signal for producing a filtered intermediate frequency signal, and an RF output offset phase-locked loop responsive to the filtered intermediate frequency signal and responsive to the signal at the multiple of the intermediate frequency for producing an RF transmission signal. The local oscillator includes a phase-locked loop digital synthesizer having digital circuits for channel selection, and the local oscillator produces a frequency equal to a frequency of the RF transmission signal multiplied by a factor equal to the multiple divided by the sum of one plus the multiple when the phase-locked loop digital synthesizer achieves a lock condition.

In accordance with still another aspect, the disclosed method and apparatus provides a plural-band wireless communications transceiver circuit for operation in EGSM (Global System for Mobile Communications), DCS (Digital Cellular Systems), and PCS (Personal Communications Service). The transceiver circuit includes a channel-selecting voltage-controlled oscillator, a two-step up-conversion plural-band wireless transmitter for EGSM transmission and DCS or PCS transmission upon a transmission channel selected by the channel-selecting voltage-controlled oscillator, and a direct-conversion plural-band wireless receiver for EGSM reception and DCS or PCS reception of a reception channel selected by the channel-selecting voltage-controlled oscillator.

BRIEF DESCRIPTION OF THE DRAWINGS

The disclosed method and apparatus will more clearly understood upon reading the following detailed description with reference to the accompanying drawings, in which.

DETAILED DESCRIPTION

Figure 1:
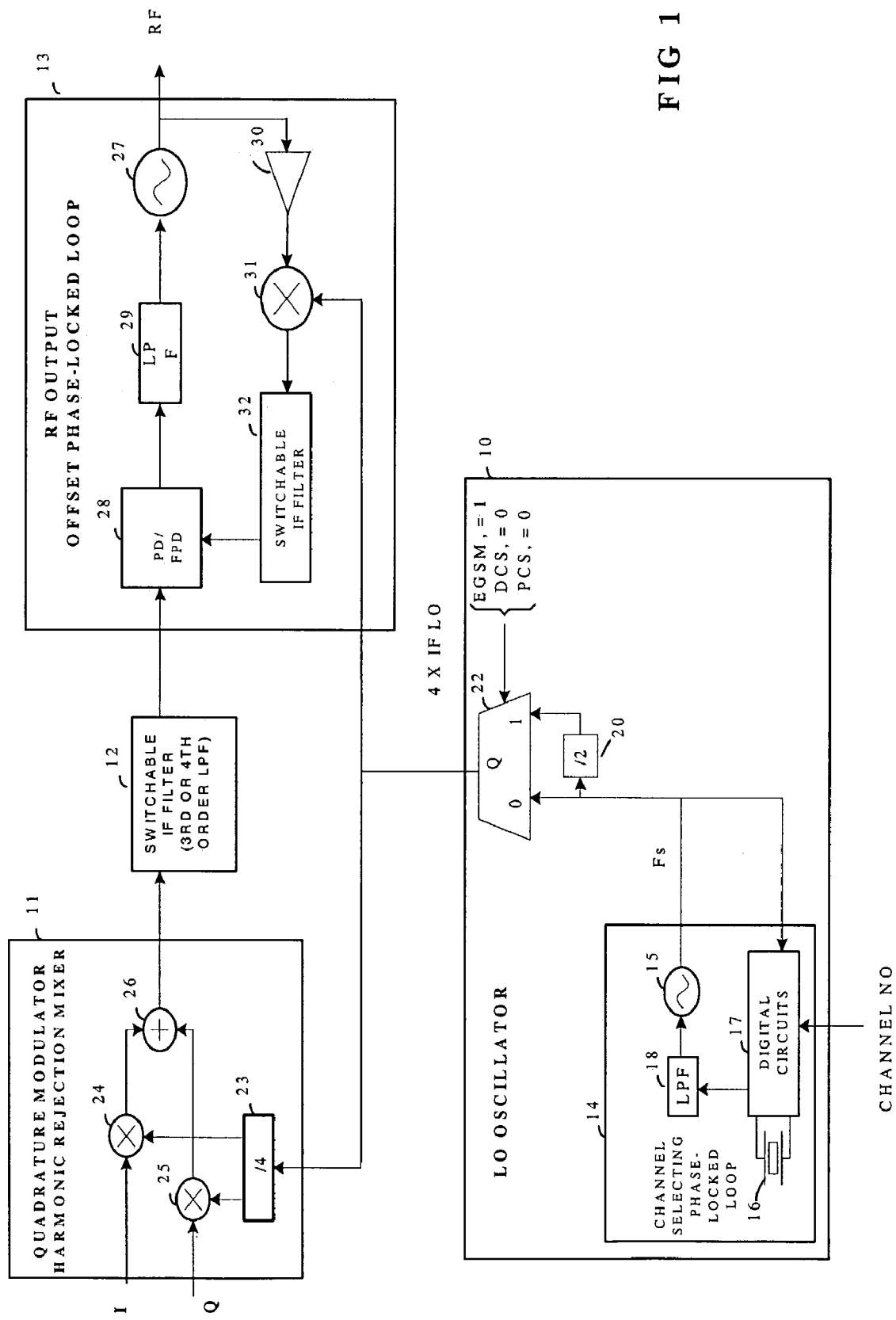
FIG. 1 is a block diagram of a first embodiment of the disclosed method and apparatus, in which an image reject offset mixer operating at the RF transmission frequency in an RF output offset phase-locked loop down-converts the RF transmission signal to intermediate frequency using a local oscillator signal.

FIG. 1 shows a first embodiment of a wireless communication transmitter employing a two-step up-conversion architecture in accordance with the disclosed method and apparatus. The transmitter includes a local oscillator 10, a quadrature modulator harmonic rejection mixer 11, a switchable intermediate frequency (IF) filter 12, and an RF output offset phase-locked loop 13.

The local oscillator 10 generates a digital signal at four times an intermediate local oscillator frequency. This digital signal is provided to the quadrature modulator harmonic rejection mixer 11 and to the RF output offset phase-locked loop 13. The resulting output from the local oscillator 10 is one-fifth of the RF transmission frequency output from the RF output offset phase-locked loop 13.

Figure 9:
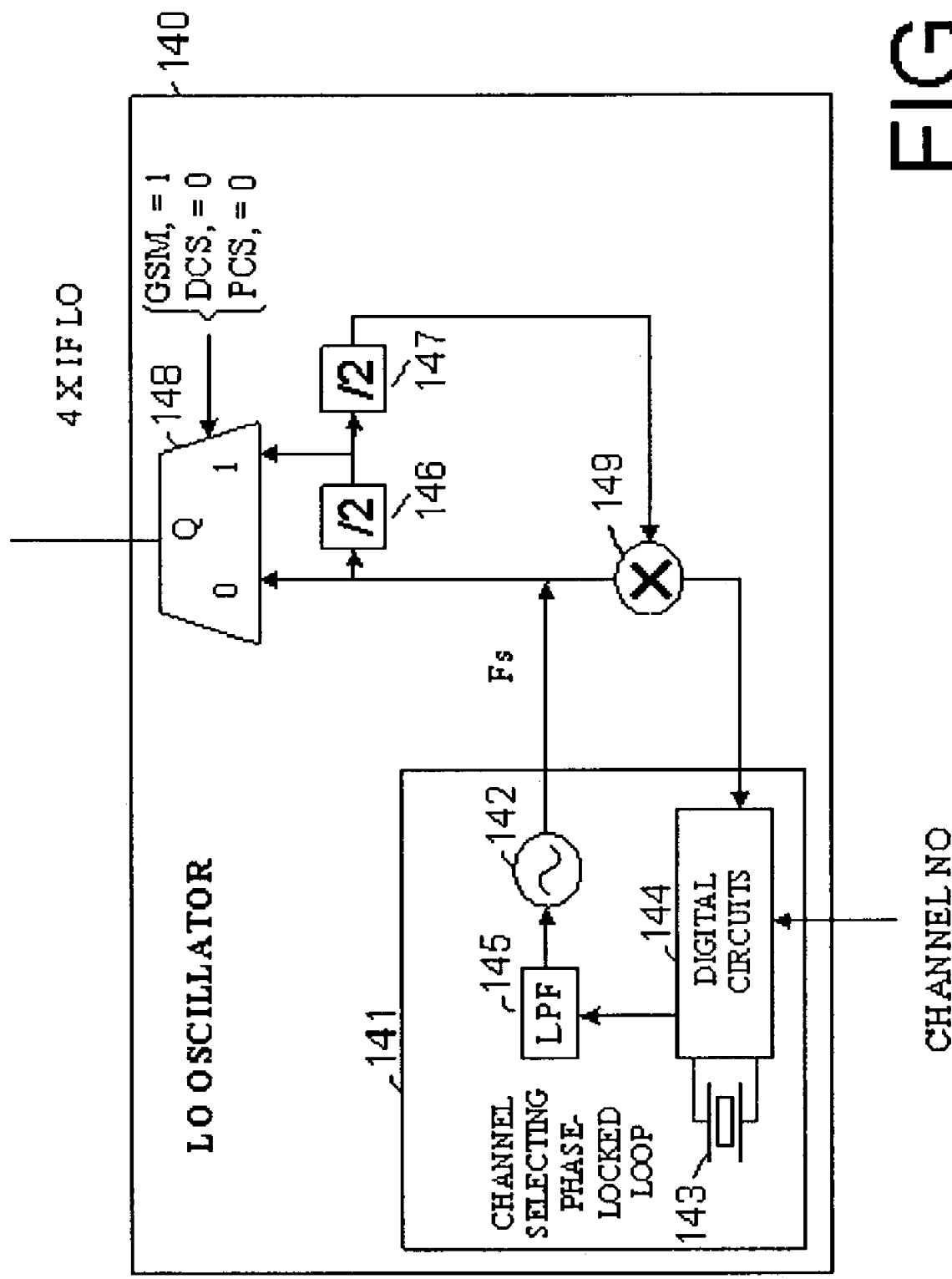
FIG. 9 is a block diagram of an alternative construction of a local oscillator, which includes a fractional-N phase-locked loop While the disclosed method and apparatus is susceptible to various modifications and alternative forms, specific embodiments thereof have been shown by way of example in the drawings and will be described in detail. It should be understood, however, that it is not intended to limit the form of the invention to the particular forms shown, but on the contrary, the intention is to cover all modifications, equivalents, and alternatives falling within the scope of the invention as defined by the appended claims.

The local oscillator 10 includes a conventional channel selecting integer or fractional-N phase-locked loop 14. The phase-locked loop 14 includes a voltage-controlled oscillator (VCO) 15. (A fractional-N phase-locked loop circuit is shown in FIG. 9, which is further described below.) The local oscillator 10 is intended to produce a frequency equal to a frequency of the RF transmission signal multiplied by a factor equal to the multiple divided by the sum of one plus the multiple when the phase-locked loop digital synthesizer achieves a lock condition.

The transmitter architecture of FIG. 1 ensures that the RF transmission frequency produced by the RF output offset phase-locked loop 13 is a factor of 5/4 times the frequency of the local oscillator 10 for EGSM and DCS or PCS bands. Therefore, the channel selecting phase-locked loop 14 will control RF transmission channel selection, with a 160 kHz channel step size when a 19.2 MHz crystal 16 is used. For the lower frequency EGSM band, the channel selecting phase-locked loop 14 will control RF transmission channel selection in a similar fashion, although the step size will be double of the step size for the higher frequency bands.

The transmitter circuit in FIG. 1 is capable of electronic switching among three RF transmission frequency bands, including a relatively low frequency band of 880–915 MHz for EGSM service, and two relatively high frequency bands, including a 1.710–1.785 GHz band for DCS service, and a 1.850–1.910 GHz band for PCS service. To switch between the high and low frequency bands, a multiplexer 22 selects either the output of the VCO 15 for operation in the high frequency bands, or the output of the toggle flip-flop 20 for operation in the low frequency band. When switching between bands, the upper cutoff frequency of the switchable IF filter 12 is also switched to just above the upper intermediate frequency for operation in the selected band. For EGSM service, the intermediate LO frequency ranges from 176 to 183 MHz. For DCS service, the intermediate LO frequency ranges from 342 to 357 MHz. For PCS service, the intermediate LO frequency ranges from 370 to 382 MHz. Therefore, for EGSM service, the VCO 15 produces a frequency of from 1.408 to 1.464 GHz. For DCS service, the VCO 15 produces a frequency of from 1.368 to 1.428 GHz. For PCS service, the VCO 15 produces a frequency of from 1.480 to 1.528 GHz.

As shown in FIG. 1, the quadrature modulator harmonic rejection mixer 11 includes a divide-by-four circuit 23, an in-phase balanced modulator 24, a quadrature-phase balanced modulator 25, and a summer 26. As further described below with reference to FIGS. 3 to 5, these components 23, 24, 25, and 26 are constructed for harmonic rejection in order to reduce the requirements for the switchable IF filter 12. The harmonic rejection property of the quadrature modulator 11 and the third-order low-pass characteristic of the switchable IF filter 12 ensure that the harmonics of the intermediate frequency signal is at least about 65 dB down from the fundamental amplitude upon reaching the RF output offset phase-locked loop 13.

The reduced requirements for the switchable IF filter 12 permit the IF filter to be entirely integrated on a single monolithic silicon integrated circuit chip also containing the quadrature modulator 11 and other active components of the transmitter in FIG. 1. For example, the switchable IF filter 12 is simply a third-order or fourth order low-pass R-C active filter having a switchable upper cut-off frequency. The upper cut-off frequency, for example, is decreased for the lower-frequency EGSM band by electronically switching additional capacitance into the IF filter 12.

The RF output offset phase-locked loop 13 includes a conventional VCO 27 producing an RF transmission signal, a conventional phase detector (PD) and frequency-phase detector (FPD) 28, and a conventional low-pass loop filter 29. The RF output offset phase-locked loop 13 further includes an automatic level control amplifier 30, an image reject offset mixer 31, and a switchable IF filter 32. (The construction of the image reject offset mixer is similar to the construction of a single-sideband mixer 122 shown in FIG. 6 and further described below).

The automatic level control amplifier 30 ensures that the image reject offset mixer 31 will perform linear mixing of the RF signal fed back from the VCO 27 over the input range of the image reject offset mixer despite some variation in the amplitude produced by the VCO. If an automatic level control amplifier is not used, it is preferred to pre-distort the signal applied to the modulator in accordance with an inverse tangent transfer function in order to avoid overdriving the modulator. The image reject offset mixer 31 mixes the RF signal with the 4 X IF LO signal from the multiplexer 22 of the local oscillator 10 to produce sum and difference frequency signals at about ⅗ths of the RF transmission frequency and at about the intermediate LO frequency.

The switchable IF filter 32 selects the difference frequency signal from the image reject offset mixer 31. The switchable IF filter 32 has its cut-off frequency switched between the relatively low frequency EGSM band and the relatively high frequency DCS and PCS bands. The switchable IF filter 32 can be similar to the switchable IF filter 12. Moreover, the center frequency of the VCO 27 is switched as a function of the selected band so that the RF transmission frequency is greater than the frequency of the 4 X IF LO signal, ensuring that the RF output offset phase-locked loop quickly becomes locked for an RF transmission frequency of five times the intermediate LO frequency.

In the transmitter of FIG. 1, the RF output offset phase-locked loop 13 locks onto the sum of the frequency of the signal from the IF filter 12 and the frequency of the 4 X IF LO signal from the multiplexer 22 of the local oscillator 10. This is done by applying the signal from the IF filter 12 to the conventional phase detector and frequency-phase detector 28, and applying the 4 X LO signal to a balanced modulator 31 operating at the RF transmission frequency.

Figure 2:
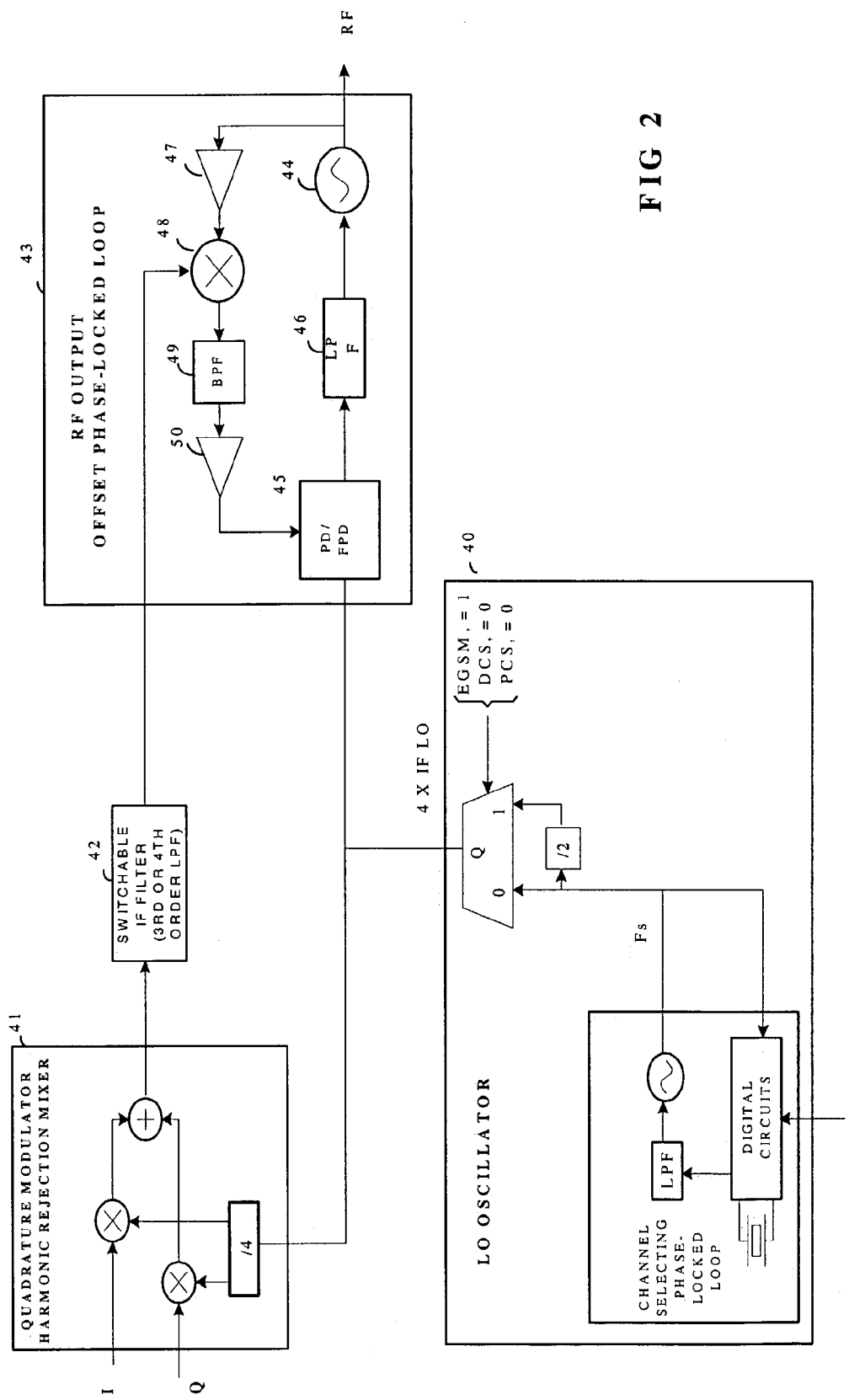
FIG. 2 is a block diagram of a second embodiment of the disclosed method and apparatus, in which an image reject offset mixer operating at the RF transmission frequency in an RF output offset phase-locked loop down-converts the RF transmission signal to 4 times intermediate frequency using an intermediate frequency signal.

In an alternative arrangement, as shown in FIG. 2, the 4 X LO signal is applied to a conventional phase detector and frequency-phase detector 45, and the signal from the switchable IF filter 42 is applied to the image reject offset mixer 50 operating at the RF transmission frequency. The transmitter circuit of FIG. 2 also includes a local oscillator 40 having the same construction as the local oscillator 10 in FIG. 1, a quadrature modulator harmonic rejection mixer 41 having the same construction as the quadrature modulator 11 in FIG. 1. The switchable IF filter 42 has the same construction as the switchable IF filter 12 in FIG. 1. However, the transmitter circuit of FIG. 2 includes an RF output offset phase-locked loop 43 that is different from the RF output offset phase-locked loop 13 of FIG. 1.

The RF output offset phase-locked loop 43 in FIG. 2 includes a conventional VCO 44 operating at the RF transmission frequency, the conventional phase detector (PD) and frequency-phase detector (FPD) 45, and a conventional low-pass loop filter 46. The RF output offset phase-locked loop 43 further includes an automatic level control amplifier 47 having the same construction as the automatic level control amplifier 30 of FIG. 1, and an image reject offset mixer 48 having the same construction as the balanced modulator 31 in FIG. 1. However, the image reject offset mixer 48 mixes the IF signal from the IF filter 42 with the RF transmission signal to produce a sum signal at a frequency of about six-fifths of the RF transmission frequency and a difference signal at a frequency of about four-fifths of RF transmission frequency. Preferably the image reject offset mixer provides linear mixing of both the IF signal and the RF transmission signal, in order to reduce in-channel spurs and intermodulation distortion products, and improve image rejection.

A band-pass filter (BPF) 49 selects the difference signal at a frequency of about four-fifths of the RF transmission frequency. At least the upper cutoff frequency of the band-pass filter is switchable at least between operation at the lower frequency EGSM band and the higher frequency DCS and PCS bands. The selected difference signal from the band-pass filter 49 is limited to a substantially constant amplitude in a limiter 50 and applied to the conventional phase detector and frequency-phase detector 45. The phase detector and frequency-phase detector 45 compares the frequency or phase of the limited difference signal to the frequency or phase of the 4 X LO signal from the local oscillator 40.

Figure 3:
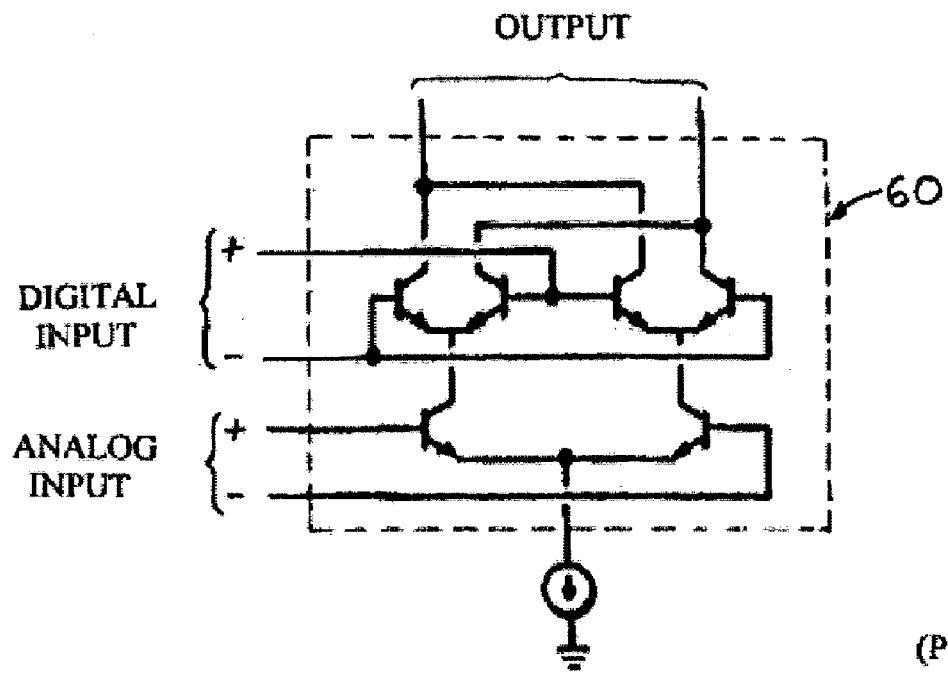
FIG. 3 is a schematic diagram of a conventional balanced modulator Gilbert cell, which is used in the quadrature modulator harmonic rejection mixer of FIG. 5.

In a preferred form of construction, the balanced modulators and image reject offset mixers (24, 25, 31, 48) in FIGS. 1 and 2 use conventional bipolar transistor Gilbert cells. One such Gilbert cell generally designated 60 is shown in FIG. 3 for the purpose of identifying the various inputs and outputs of the six Gilbert cells shown in FIG. 5. In other words, each of the Gilbert cells shown in FIG. 5 has a pair of outputs at the top of the cell, two digital inputs at the top left of the cell, two analog inputs at the bottom left of the cell, a current sink connection at the bottom of the cell, and an internal configuration as shown in FIG. 3.

When conventional bipolar transistor Gilbert cells are used, it is also convenient to integrate the Gilbert cells with current-mode emitter coupled logic (ECL) circuits on a common monolithic silicon integrated circuit chip. The ECL circuits may use the same bias voltage levels as the Gilbert cells. Shown in FIG. 4, for example, is a schematic diagram of one gated latch cell generally designated 70. The data outputs (Q and Q bar) of this gated latch cell 70 are at an upper bias level for driving the digital inputs of the Gilbert cells. The set (S) and reset (R) inputs of this gated latch cell 70 are operated at this upper bias level. The clock inputs (C and C bar) operate at a lower bias level of about a volt or more below the upper bias level. The lower bias level is also the bias level for the analog inputs of the Gilbert cells.

Figure 4:
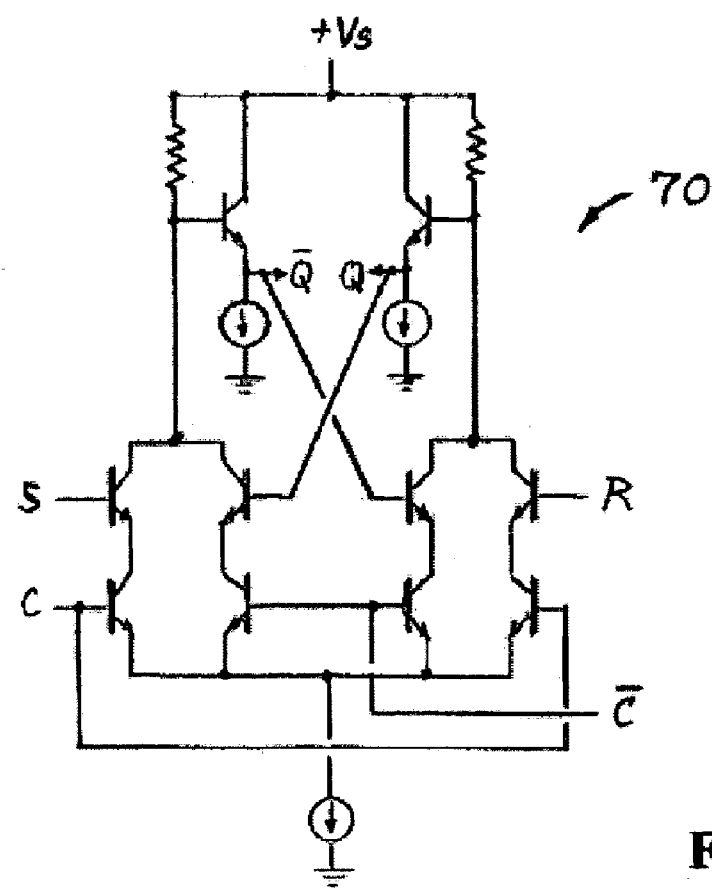
FIG. 4 is a schematic diagram of a gated latch cell, which is used in the quadrature modulator harmonic rejection mixer of FIG. 5.
Figure 5:
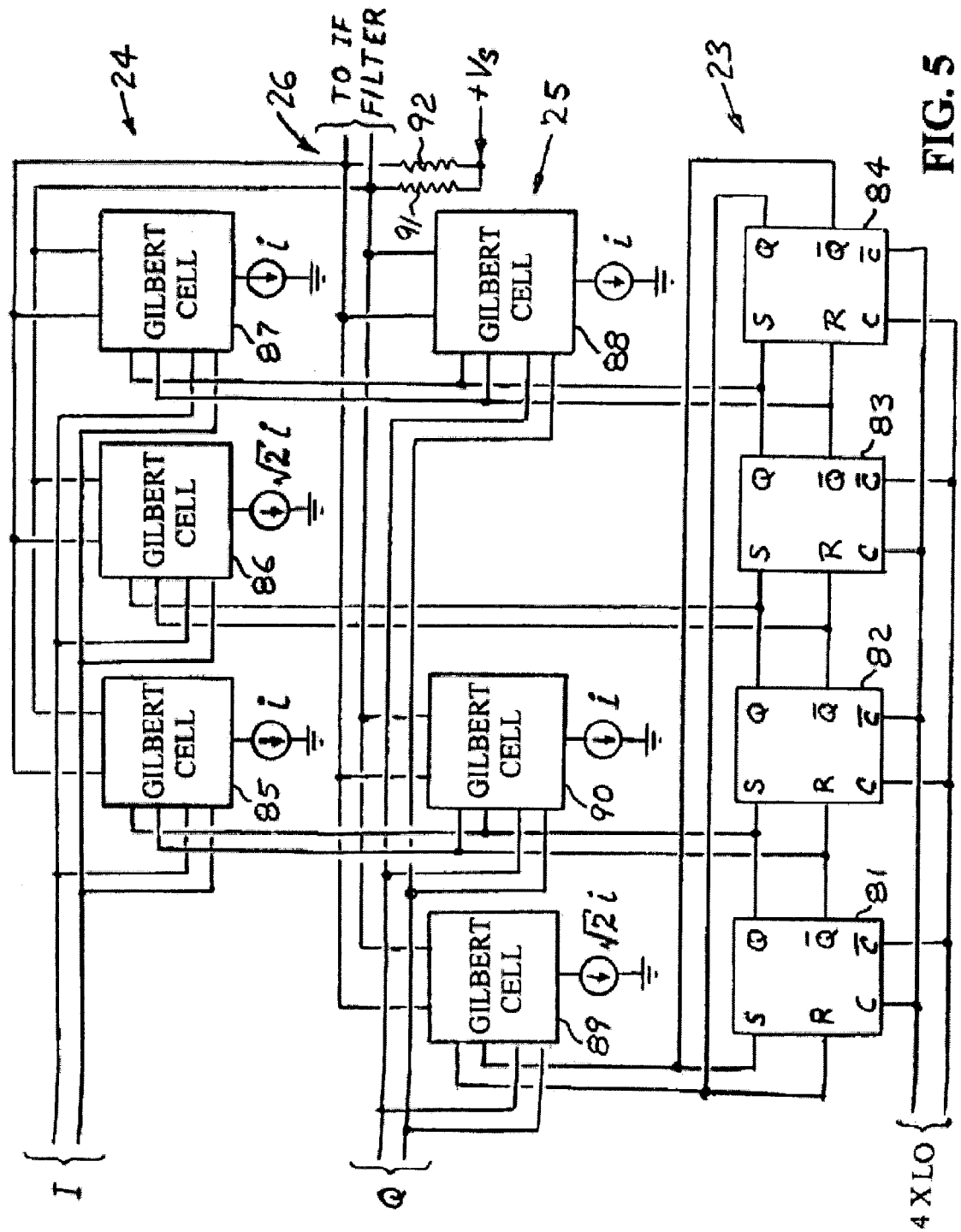
FIG. 5 is a block diagram of a quadrature modulator harmonic rejection mixer, which is used in FIG. 1 and FIG. 2.

FIG. 5 shows how the Gilbert cells of FIG. 3 and the gated latch cells of FIG. 4 are combined to form the quadrature modulator harmonic rejection mixer 11 of FIG. 1. Four gated latch cells 81, 82, 83, and 84 are cascaded in series to form a divide-by-four shift register counter 23. The gated latch cells 81 and 82 together comprise one master-slave delay flip-flop, and the gated latch cells 83 and 84 comprise another master-slave delay flip-flop. A logic inversion occurs in the feedback path from the Q and Q bar outputs of the fourth gated latch cell 84 to the S and R inputs of the first gated latch cell 81. During operation, the divide-by-four shift register counter 23 provides four phases of a digital clock signal at the intermediate LO frequency. Each of the gated latch cells 81, 82, 83, 84 provides a respective one of the four phases of this digital clock signal at the intermediate LO frequency.

The in-phase modulator 24 is comprised of three Gilbert cells 85, 86, 87 driven by phases 1, 2, and 3 of the LO digital clock signal, respectively. The Gilbert cell 86 has a current sink weighted by a factor of the square root of two with respect to the current sinks for the Gilbert cells 85 and 87. The weighting of the current sinks is done in a conventional fashion using current mirror techniques. The use of more than one Gilbert cell for the in-phase modulator 24, together with excitation of the Gilbert cells 85, 86, and 87 by the respective digital clock phases and the current sink weighting, provide the desired harmonic rejection.

The quadrature-phase modulator 25 is constructed in a fashion similar to the in-phase modulator 24 except that the Gilbert cells 88, 89, and 90 are driven by respective clock phases delayed by 90 degrees of the LO clock signal in comparison to the Gilbert cells 85, 86 and 87.

The summer 26 is provided by a parallel connection of outputs of the Gilbert cells 85 to 90 to a pair of shared load resistors 91 and 92. The load resistors 91 and 92 produce a differential voltage proportional to the sum of the differential currents sinked by the Gilbert cells.

In view of the above, there has been described a two-step up-conversion wireless communications transmitter permitting a high level of integration on a single monolithic silicon integrated circuit chip. The quadrature modulator uses a harmonic rejection mixer to reduce the IF filtering requirements. Moreover, the quadrature modulator operates at an intermediate frequency permitting multiple phases of a local oscillator signal to be produced digitally for reduction of quadrature modulator phase error. The local oscillator incorporates a phase-locked loop permitting the use of conventional channel selecting digital circuits, reducing LO integrated phase noise, and reducing switching time.

It should be apparent that the circuits shown in the figures may be modified in various ways. For example, N-channel enhancement-mode field-effect transistors can be directly substituted for the NPN transistors shown in FIGS. 3 and 4. It may be desirable to use gallium arsenide field-effect transistors in order to permit operation at higher RF transmission frequencies. Alternatively, it may be desirable to use silicon field-effect transistors in order to integrate the wireless transmitter with CMOS digital circuits using a standard CMOS process. If a standard CMOS process were used, a conventional CMOS gated latch cell could be substituted for the gated latch cell shown in FIG. 4.

FIGS. 1 and 2 show multi-band circuits, which could be simplified for operation only on either the lower EGSM band or the higher DCS and PCS bands. In this case, the multiplexer (22 in FIG. 1) could be eliminated, the IF filter (12 in FIG. 1 or 42 in FIG. 2) need not be switchable, and the RF output VCO (27 in FIG. 1 or 44 in FIG. 2) need not have its center frequency switched between the lower and higher bands.

Figure 6:
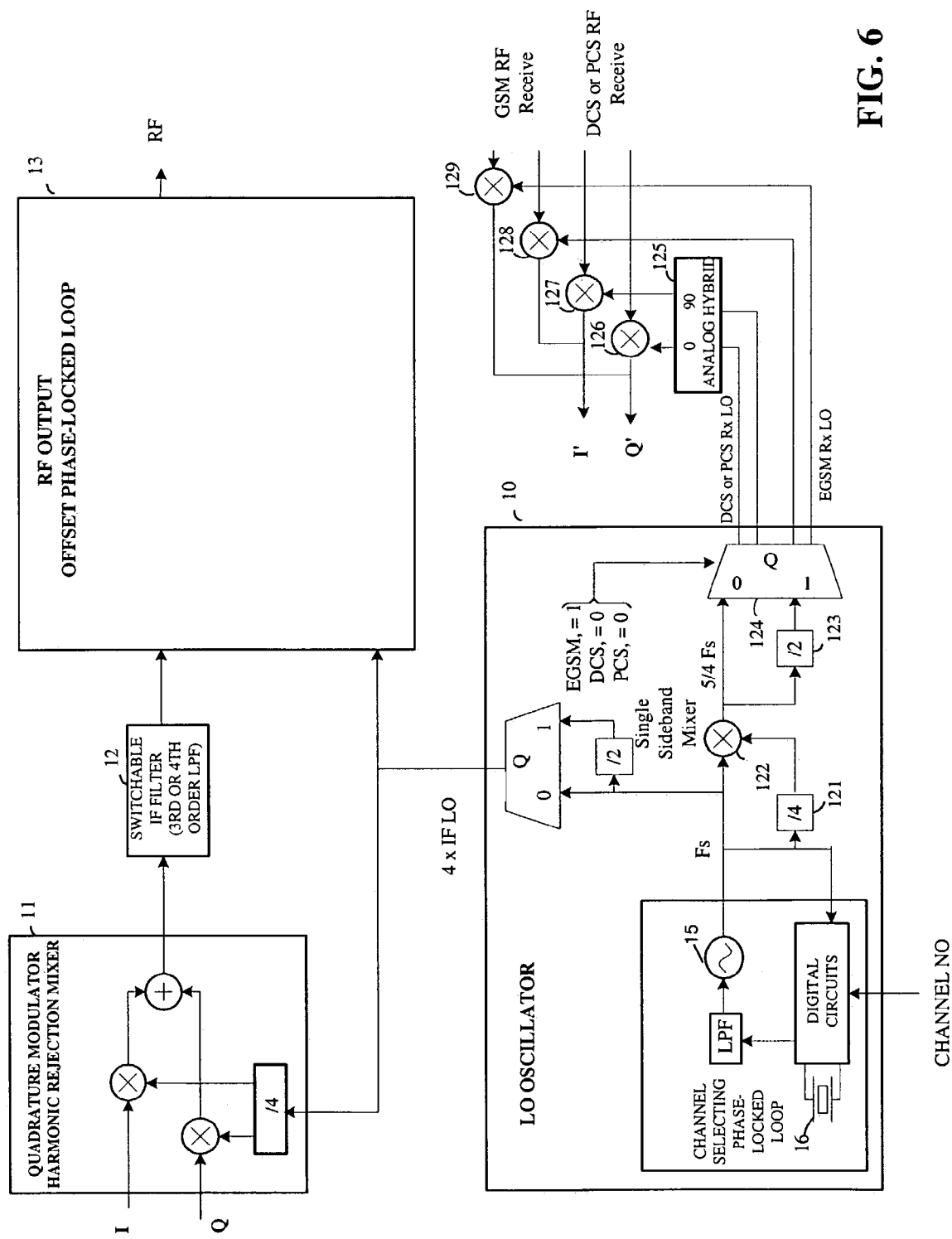
FIG. 6 is a block diagram showing how an RF local oscillator signal for a direct conversion receiver can be produced from the VCO signal of the transmitter local oscillator of FIG. 1 or FIG. 2 to provide a wireless telecommunications transceiver.

FIG. 6 shows how it is possible to produce a local oscillator signal from the recieve local oscillator generator circuit for a direct conversion receiver via the channel select phase-locked loop in order to provide a wireless telecommunications transceiver. As shown in FIG. 6, the receive local oscillator generator circuit includes a divide-by-four circuit 121 divides the signal from the VCO 15 at the frequency Fs by four in frequency. A single sideband mixer 122, as further described below with reference to FIG. 7, mixes the VCO signal with the output of the divide-by-four circuit to produce a signal at a frequency of ⅝ Fs. A divide-by-2 digital hybrid circuit 123, further shown and described below with reference to FIG. 8, divides the frequency of the output of the single-sideband mixer 122 by two. A multiplexer 124, further shown and described below with reference to FIG. 8, selects either the output of the single-sideband mixer (for the case of DCS or PCS) or the output of the divider 123 (for the case of EGSM) to produce the receiver local oscillator signal. The PCS or DCS receive local oscillator signal excites an analog hybrid circuit 125 to produce respective in-phase (0°) and quadrature phase (90°) signals applied to a respective in-phase demodulator 126 and quadrature-phase demodulator 127. Suitable analog hybrid circuits will be discussed further below with reference to FIG. 7. The in-phase (0°) and quadrature phase (90°) signals for GSM receive local oscillator signal circuit is applied to a respective in-phase demodulator 128 and quadrature-phase demodulator 129 from the divider 123 via the multiplexer 124. Each of the demodulators 126, 127, 128, 129 can be a single Gilbert cell as shown in FIG. 3. The in-phase demodulator 126 demodulates the DCS or PCS RF receive signal to produce an in-phase baseband signal I', and the quadrature-phase demodulator 127 demodulates the DCS or PCS RF receive signal to produce a quadrature-phase baseband signal Q'. The in-phase demodulator 128 demodulates the EGSM RF receive signal to produce an in-phase baseband signal I', and the quadrature-phase demodulator 129 demodulates the EGSM RF receive signal to produce a quadrature-phase baseband signal Q'.

During the typical operation of the transceiver in FIG. 6, the receiver and transmitter provide duplex telephone operation but the receiver and transmitter do not operate simultaneously. Instead, the transmitter and receiver operate in a time-shared fashion that is transparent to the user. This permits the frequency Fs of the VCO to be changed during the switch between transmission and reception. For example, the operating frequencies (in MHz) are shown in the tables below:

| | Transmission | | | | | |
| --- | --- | --- | --- | --- | --- | --- |
| | RF Low | RF High | Fs Low | Fs High | IF Low | IF High |
| EGSM | 880 | 915 | 1408 | 1464 | 176 | 183 |
| DCS | 1710 | 1785 | 1368 | 1428 | 342 | 357 |
| PCS | 1850 | 1910 | 1480 | 1528 | 370 | 382 |

| | Reception | | | |
| --- | --- | --- | --- | --- |
| | RF Low | RF High | Fs Low | Fs High |
| EGSM | 925 | 960 | 1480 | 1536 |
| DCS | 1805 | 1880 | 1444 | 1504 |
| PCS | 1930 | 1990 | 1544 | 1592 |

Figure 7:
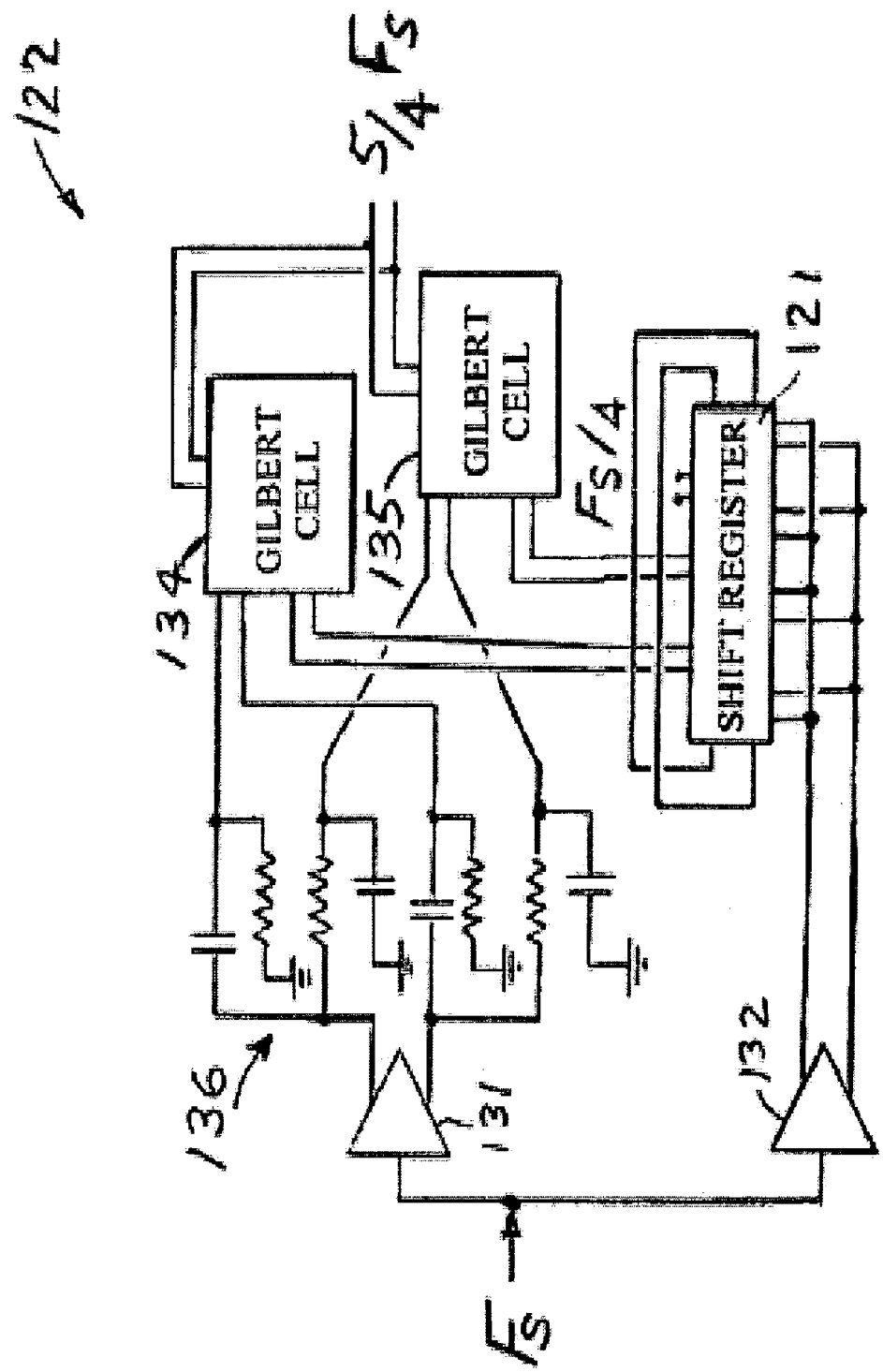
FIG. 7 is a schematic diagram of a single sideband mixer used in FIG. 6.

FIG. 7 shows a schematic diagram of the single-sideband mixer 122. The output of the VCO (15 in FIG. 6) at the frequency Fs is applied to a pair of buffers 131 and 132. The buffer 132 clocks the divide-by-four circuit 121, which is a shift register similar to the shift register 23 in FIG. 5. The divide-by-four circuit provides a complementary pair of in-phase clocks to a first Gilbert cell 134 and a complementary pair of quadrature-phase clocks at a frequency of Fs/4 to a second Gilbert cell 135. The buffer 131 drives an analog hybrid circuit 136 providing resistor/capacitor lead/lag connections to the Gilbert cells 135. Each lead/lag connection provides a phase shift of plus or minus 45 degrees, so that the first Gilbert cell receives an in-phase signal at the frequency Fs and the second Gilbert cell receives a quadrature-phase signal at the frequency Fs. The outputs of the two Gilbert cells 134, 135 are connected in parallel, causing the lower sideband signals at ¾ Fs from the Gilbert cells to cancel, and the upper sideband signals at 5/4 Fs from the Gilbert cells to add constructively.

Although the single-sideband modulator 122 shows an analog hybrid circuit 136 for producing complementary in-phase and quadrature-phase signals at the frequency Fs, it is also possible for the VCO (15 in FIG. 6) to be constructed to produce such in-phase and quadrature-phase signals. For example, the frequency-selecting element in the VCO can be an analog or digital delay line in a feedback circuit, and the analog or digital delay line can be tapped at a zero degree phase location to provide the in-phase signal and at a 90 degree phase location to provide the quadrature phase signal. Such a digital delay line, for example, can be constructed of four ECL inverters in series, in a fashion similar to the shift register 23 of FIG. 5, by substituting a respective ECL inverter for each gated latch in the shift register.

Figure 8:
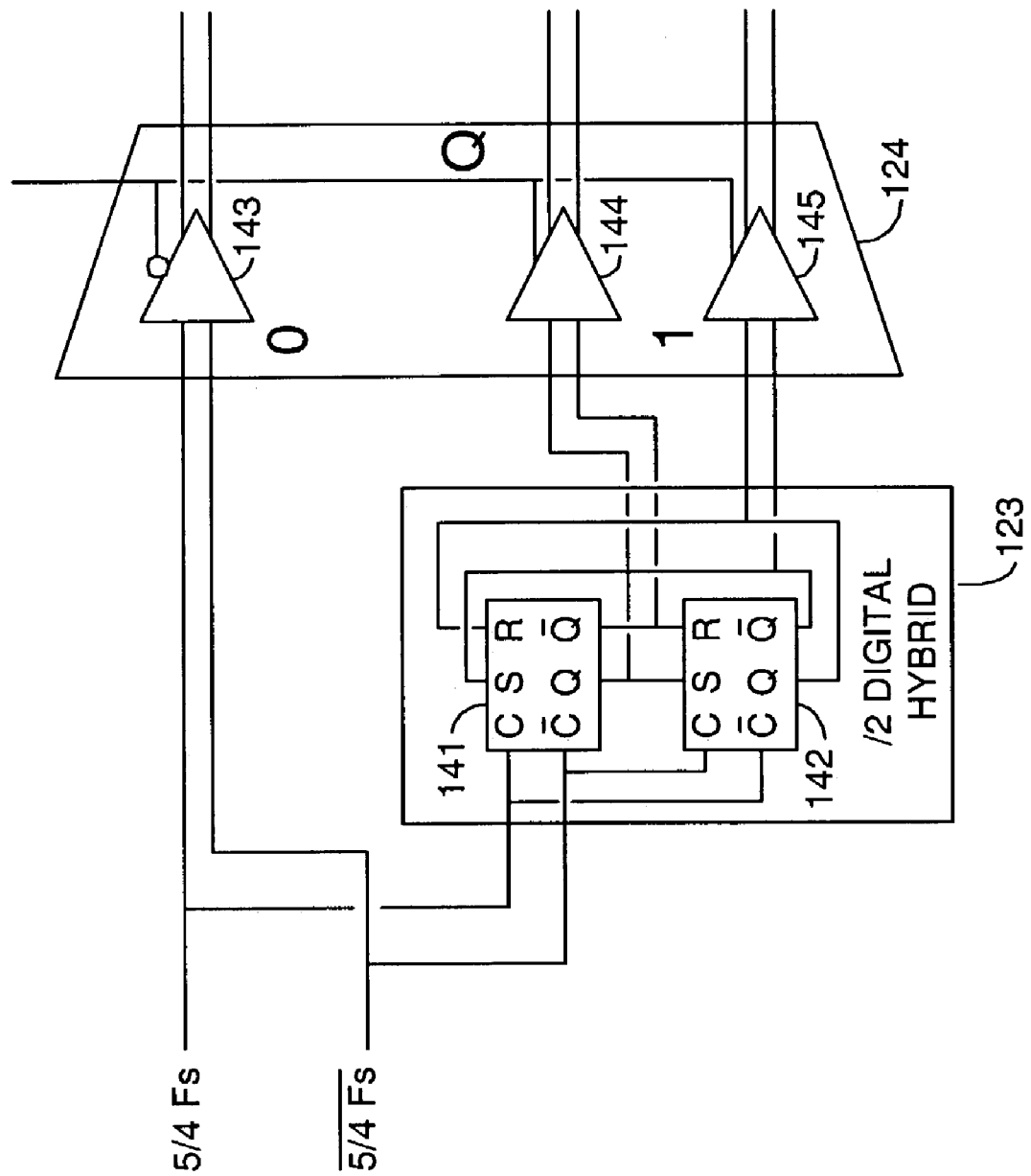
FIG. 8 is a schematic diagram of a digital hybrid and a multiplexer introduced in FIG. 6.

FIG. 8 shows in greater detail the divide-by-two digital hybrid 123 and the multiplexer 124 introduced in FIG. 6. The divide-by-two digital hybrid includes a first S-R latch 141 and a second S-R latch 142. The latches 141 and 142 are connected to form a master-slave D-type flip-flop having negative feedback to function as a divide-by-two. The first S-R latch provides an in-phase output and the second S-R latch provides a quadrature-phase output. The multiplexer 124 includes a first transmission gate 143 enabled for a logic low control signal, a second transmission gate 144 enabled for a logic high control signal, and a third transmission gate 145 enabled for a logic high control signal.

FIG. 9 shows a local oscillator 140 including a fractional-N phase-locked loop. In this example, the fractional-N phase locked loop includes channel selecting digital circuits 144 originally intended to produce the RF transmission frequency. In order to produce the desired 4 X IF LO frequency, a multiplier 149 is inserted into the feedback path from the output of the VCO 142 to the input of the digital circuits 144. The frequency (Fs) of VCO 142 is divided by two in a first toggle flip-flop 146 and again by two in a second toggle flip-flop 147, so that the second toggle flip-flop 147 outputs a digital signal at one-quarter of the frequency (Fs) of the VCO 142. This digital signal is applied to the multiplier 149 which functions as an exclusive-OR gate performing a fractional multiplication. The total delay through the two toggle flip-flops 146 and 147 is about one-quarter of a period of the frequency (Fs) of the VCO 142. Therefore, the multiplier 149 adds one additional logic transition for every four transitions in the VCO signal, and the signal feed back from the multiplier 149 to the digital circuits 144 of the phase-locked loop 141 is increased in instantaneous frequency by a factor of 5/4.

The signal fed back from the multiplier 149 to the phase-locked, loop is divided down by the digital circuits 144, and these digital circuits are responsive to the number of transitions in the signal from the multiplier 149. Therefore, when the phase-locked loop 141 is phase locked, the VCO 142 produces a signal at a frequency (Fs) that is a factor 4/5 less than what the phase-locked loop was originally intended to produce. A multiplexer 148 provides the 4 X IF LO signal. The multiplexer 148 selects the signal Fs for the DSC and PCS bands, and selects the output of the first toggle flip-flop 146 for the EGSM band.

What is claimed is:

1. A wireless communications transmitter circuit comprising:
    a local oscillator for producing a signal at a multiple of an intermediate frequency;
    a quadrature modulator harmonic rejection mixer responsive to the signal at the multiple of the intermediate frequency for modulating an in-phase base-band signal and a quadrature-phase base-band signal to produce an intermediate frequency signal, wherein the quadrature modulator harmonic rejection mixer includes:
        a first circuit for generating multiple phases of a digital signal at the intermediate frequency responsive to the multiple of the intermediate frequency, wherein the multiple phases of the digital signal at the intermediate frequency includes a first set of at least two respective phases out of phase by ninety degrees relative to a second set of at least two respective phases;
        a second circuit for combining the in-phase base-band signal and the first set of at least two respective phases of the digital signal at the intermediate frequency responsive to a first set of at least two respective current sink weightings to produce a first set of at least two respective intermediate frequency output signals;
        a third circuit for combining the quadrature-phase baseband signal and the second set of at least two respective phases of the digital signal at the intermediate frequency responsive to a second set of at least two respective current sink weightings to produce a second set of at least two respective intermediate frequency output signals; and
        a fourth circuit for combining the first set of at least two respective intermediate frequency output signals and the second set of at least two respective intermediate frequency output signals to produce the intermediate frequency signal;
    a filter responsive to the intermediate frequency signal for producing a filtered intermediate frequency signal; and
    an RF output offset phase-locked loop responsive to the filtered intermediate frequency signal and responsive to the signal at the multiple of the intermediate frequency for producing an RF transmission signal;
    wherein the local oscillator produces a frequency equal to a frequency of the RF transmission signal multiplied by said multiple and divided by a sum of one plus the multiple.

2. The wireless communications transmitter circuit as claimed in claim 1, wherein the local oscillator includes a phase locked loop and a voltage-controlled oscillator.

3. The wireless communications transmitter circuit as claimed in claim 2, wherein the phase-locked loop is an integer-N phase-locked loop.

4. The wireless communications transmitter circuit as claimed in claim 2, wherein the phase-locked loop is a fractional-N phase-locked loop.

5. A wireless communications transmitter circuit comprising
    a local oscillator for producing a signal at a multiple of an intermediate frequency;
    a quadrature modulator harmonic rejection mixer responsive to the signal at the multiple of the intermediate frequency for modulating an in-phase base-band signal and a quadrature-phase base-band signal to produce an intermediate frequency signal, wherein the quadrature modulator harmonic rejection mixer includes:

a first circuit for generating multiple phases of a digital signal at the intermediate frequency responsive to the multiple of the intermediate frequency, wherein the multiple phases of the digital signal at the intermediate frequency includes a first set of at least two respective phases out of phase by ninety degrees relative to a second set of at least two respective phases;

a second circuit for combining the in-phase base-band signal and the first set of at least two respective phases of the digital signal at the intermediate frequency responsive to a first set of at least two respective current sink weightings to produce a first set of at least two respective intermediate frequency output signals;

a third circuit for combining the quadrature-Phase base-band signal and the second set of at least two respective phases of the digital signal at the intermediate frequency responsive to a second set of at least two respective current sink weightings to produce a second set of at least two respective intermediate frequency output signals; and a fourth circuit for combining the first set of at least two respective intermediate frequency output signals and the second set of at least two respective intermediate frequency output signals to produce the intermediate frequency signal;

a filter responsive to the intermediate frequency signal for producing a filtered intermediate frequency signal; and an RF output offset phase-locked loop responsive to the filtered intermediate frequency signal and responsive to the signal at the multiple of the intermediate frequency for producing an RF transmission signal;

wherein the local oscillator is switchable for changing the intermediate frequency by a factor of two, and die filter is switchable for producing a filtered intermediate frequency signal when the intermediate frequency is changed by a factor of two.

6. The wireless communications transmitter circuit as claimed in claim 5, wherein the filter is a third order low pass filter.

7. The wireless communications transmitter circuit as claimed in claim 5, wherein the filter is a fourth order low pass filter.

8. A wireless communications transmitter circuit comprising, in combination:

a local oscillator for producing a signal at a multiple of an intermediate frequency;

a quadrature modulator harmonic rejection mixer responsive to the signal at the multiple of the intermediate frequency for modulating an in-phase base-band signal and a quadrature-phase base-band signal to produce an intermediate frequency signal, wherein the quadrature modulator harmonic rejection mixer includes;

a shift register counter for generating multiple phases of a digital signal at the intermediate frequency responsive to the multiple of the intermediate frequency, wherein the multiple phases of the digital signal at the intermediate frequency includes a first set of at least two respective phases out of phase by ninety degrees relative to a second set of at least two respective phases;

a first set of at least two multipliers including at least two respective Gilbert cells for combining the in-phase base-band signal and the first set of at least two respective phases of the digital signal at the intermediate frequency responsive to a first set of at least two respective current sink weightings to produce a first set of at least two respective intermediate frequency output signals;

a second set of at least two multipliers including at least two respective Gilbert cells for combining the quadrature-phase base-band signal and the second set of at least two respective phases of the digital signal at the intermediate frequency responsive to a second set of at least two respective current sink weightings to produce a second set of at least two respective intermediate frequency output signals; and an adder for combining the first set of at least two respective intermediate frequency output signals and the second set of at least two respective intermediate frequency output signals to produce the intermediate frequency signal;

a filter responsive to the intermediate frequency signal for producing a filtered intermediate frequency signal; and an RF output offset phase-locked loop responsive to the filtered intermediate frequency signal and responsive to the signal at the multiple of the intermediate frequency for producing an RF transmission signal.

9. The wireless communications transmitter as claimed in claim 8, wherein the RF output offset phase-locked loop includes a voltage-controlled oscillator responsive to a frequency control signal for producing the RF transmission signal, an offset mixer for down-converting the RF transmission signal with the signal at the multiple of the intermediate frequency to produce a difference frequency signal, and a phase detector for comparing phase of the difference frequency signal with phase of the filtered intermediate frequency signal to produce the frequency control signal.

10. The wireless communications transmitter circuit as claimed in claim 9, wherein the offset mixer is a double balanced mixer.

11. The wireless communications transmitter circuit as claimed in claim 10, wherein the offset mixer is an image reject double balanced mixer.

12. The wireless communications transmitter as claimed in claim 8, wherein the RF output offset phase-locked loop includes a voltage-controlled oscillator responsive to a frequency control signal for producing the RF transmission signal, an offset mixer for down-convening the RF transmission signal with the filtered intermediate frequency signal to produce a difference frequency signal, and a phase detector for comparing phase of the difference frequency signal with phase of the signal at the multiple of the intermediate frequency to produce the frequency control signal.

13. The wireless communications transmitter circuit as claimed in claim 12, wherein the offset mixer is a double balanced mixer.

14. The wireless communications transmitter circuit as claimed in claim 13, wherein the offset mixer is an image reject double balanced mixer.

15. A wireless communications transmitter circuit comprising:

a local oscillator for producing a signal at four times an intermediate frequency;

a quadrature modulator harmonic rejection mixer responsive to the signal at four times the intermediate frequency for modulating an in-phase base-band signal and a quadrature-phase base-band signal to produce an intermediate frequency signal, wherein the quadrature modulator harmonic rejection mixer includes:

a first circuit for generating multiple phases of a digital signal at the intermediate frequency responsive to the signal at four times the intermediate frequency, wherein the multiple phases of the digital signal at the intermediate frequency includes a first set of at least two respective phases out of phase by ninety degrees relative to a second set of at least two respective phases;

a second circuit for combining the in-phase base-hand signal and the first set of at least two respective phases of the digital signal at the intermediate frequency responsive to a first set of at least two respective current sink weightings to produce a first set of ax least two respective intermediate frequency output signals;

a third circuit for combining the quadrature-phase base-band signal and the second set of at least two respective phases of the digital signal at the intermediate frequency responsive to a second set of at least two respective current sink weightings to produce a second set of at least two respective intermediate frequency output signals; and a fourth circuit for combining the first set of at least two respective intermediate frequency output signals and the second set of at least two respective intermediate frequency output signals to produce the intermediate frequency signal;

a filter responsive to the intermediate frequency signal for producing a filtered intermediate frequency signal; and an RF output offset phase-locked loop responsive to the filtered intermediate frequency signal and responsive to the signal at four times the intermediate frequency for producing an RF transmission signal;

wherein the local oscillator includes a phase-locked loop having digital circuits for channel selection;

wherein the local oscillator produces a frequency equal to a frequency of the RF transmission signal multiplied by said multiple and divided by a sum of one plus the multiple.

16. A wireless communications transmitter circuit comprising;

a local oscillator for producing a signal at four times an intermediate frequency;

a quadrature modulator harmonic rejection mixer responsive to the signal at four times the intermediate frequency for modulating an in-phase base-band signal and a quadrature-phase base-band signal to produce an intermediate frequency signal, wherein the quadrature modulator harmonic rejection mixer includes:

a first circuit for generating multiple phases of a digital signal at the intermediate frequency responsive to the signal at four times the intermediate frequency, wherein the multiple phases of the digital signal at the intermediate frequency includes a first set ate least two respective phases out of phase by ninety degrees relative to a second set of at least two respective phases;

a second circuit for combining the in-phase base-band signal and the first set of at least two respective phases of the digital signal at the intermediate frequency responsive to a first set of at least two respective current sink weightings to produce a first set of ax least two respective intermediate frequency output signals;

a third circuit for combining the quadrature-phase base-band signal and the second set of at least two respective phases of the digital signal at the intermediate frequency responsive to a second set of at least two respective current sink weightings to produce a second set of at least two respective intermediate frequency output signals; and a fourth circuit for combining the first set of at least two respective intermediate frequency output signals and the second set of at least two respective intermediate frequency output signals to produce the intermediate frequency signal;

a filter responsive to the intermediate frequency signal for producing a filtered intermediate frequency signal; and an RF output offset phase-locked loop responsive to the filtered intermediate frequency signal and responsive to the signal at four times the intermediate frequency for producing an RF transmission signal;

wherein the local oscillator includes a phase-locked loop having digital circuits for channel selection;

wherein the local oscillator includes a flip-flop producing a signal at one-half of the frequency produced by a voltage-controlled oscillator, a multiplexer having a first input coupled to the voltage-controlled oscillator, a second input coupled to the flip-flop, and an output for providing the signal at four times the intermediate frequency, and the multiplexer is responsive to a select signal for selecting either the frequency produced by the voltage-controlled oscillator or one-half of the frequency produced by the voltage-controlled oscillator to be four times the IF local oscillator frequency.

17. A wireless communications transmitter circuit comprising:

a local oscillator for producing a signal at four times an intermediate frequency;

a quadrature modulator harmonic rejection mixer responsive to the signal at four times the intermediate frequency for modulating an in-phase base-band signal and a quadrature-phase base-band signal to produce an intermediate frequency signal, wherein the quadrature modulator harmonic rejection mixer includes:

a first circuit for generating multiple phases of a digital signal at the intermediate frequency responsive to the signal at four times the intermediate frequency, wherein the multiple phases of the digital signal at the intermediate frequency includes a first set of at least two respective phases out of phase by ninety degrees relative to a second set of at least two respective phases;

a second circuit for combining the in-phase base-band signal and the first set of at least two respective phases of the digital signal at the intermediate frequency responsive to a first set of at least two respective current sink weightings to produce a first set of at least two respective intermediate frequency output signals;

a third circuit for combining the quadrature-phase base-band signal and the second set of at least two respective phases of the digital signal at the intermediate frequency responsive to a second set of at least two respective current sink weightings to produce a second set of at least two respective intermediate frequency output signals; and a fourth circuit for combining the first set of at least two respective intermediate frequency output signals and the second set of at least two respective intermediate frequency output signals to produce the intermediate frequency signal;

a filter responsive to the intermediate frequency signal for producing a filtered intermediate frequency signal; and an RF input offset phase-locked loop responsive to the filtered intermediate frequency signal and responsive to the signal at four times the intermediate frequency for producing an RF transmission signal;

wherein the local oscillator includes a phase-locked loop having digital circuits for channel selection;

wherein the local oscillator is switchable for changing the intermediate frequency by a factor of two, and the filter is switchable for producing a filtered intermediate frequency signal when the intermediate frequency is changed by a factor of two.

18. A wireless communications transmitter circuit comprising:
    a local oscillator for producing a signal at four times an intermediate frequency;
    a quadrature modulator harmonic rejection mixer responsive to the signal at four times the intermediate frequency for modulating an in-phase base-band signal and a quadrature-phase base-band signal to produce an intermediate frequency signal;
    a filter responsive to the intermediate frequency signal for producing a filtered intermediate frequency signal; and
    an RF output offset phase-locked loop responsive to the filtered intermediate frequency signal and responsive to the signal at four times the intermediate frequency for producing an RF transmission signal;
    wherein the local oscillator includes a phase-locked loop having digital circuits for channel selection;
    wherein the quadrature modulator harmonic mixer includes a shift register counter having four gated latches and six Gilbert cells, each of the four gated latches produces a respective one of four phases of a digital signal at the intermediate frequency, and each of the Gilbert cells is responsive to a respective phase of the digital signal at the intermediate frequency.

19. A wireless communications transmitter circuit comprising:
    a local oscillator for producing a signal at four times an intermediate frequency;
    a quadrature modulator harmonic rejection mixer responsive to the signal at four times the intermediate frequency for modulating an in-phase base-band signal and a quadrature-phase base-band signal to produce an intermediate frequency signal, wherein the quadrature modulator harmonic rejection mixer includes:
        a first circuit for generating multiple phases of a digital signal at the intermediate frequency responsive to the signal at four times the intermediate frequency, wherein the multiple phases of the digital signal at the intermediate frequency includes a first set of at least two respective phases out of phase by ninety degrees relative to a second set of at least two respective phases;
        a second circuit for combining the in-phase base-band signal and the first set of at least two respective phases of the digital signal at the intermediate frequency responsive to a first set of at least two respective current sink weightings to produce a first set of at least two respective intermediate frequency output signals;
        a third circuit for combining the quadrature-phase base-band signal and the second set of at least two respective phases of the digital signal at the intermediate frequency responsive to a second set of at least two respective current sink weightings to produce a second set of at least two respective intermediate frequency output signals; and
        a fourth circuit for combining the first set of at least two respective intermediate frequency output signals and the second set of at least two respective intermediate frequency output signals to produce the intermediate frequency signal;
    a filter responsive to the intermediate frequency signal for producing a filtered intermediate frequency signal; and
    an RF output offset phase-locked loop responsive to the filtered intermediate frequency signal and responsive to the signal at four times the intermediate frequency for producing an RF transmission signal;
    wherein the local oscillator includes a phase-locked loop having digital circuits for channel selection;
    wherein the RF output offset phase-locked loop includes a voltage-controlled oscillator responsive to a frequency control signal for producing the RF transmission signal, an offset mixer for down-converting the RF transmission signal with the signal at four times the intermediate frequency to produce a difference frequency signal, and a phase detector for comparing phase of the difference frequency signal with phase of the filtered intermediate frequency signal to produce the frequency control signal.

20. A wireless communications transmitter circuit comprising:
    a local oscillator for producing a signal at four times an intermediate frequency;
    a quadrature modulator harmonic rejection mixer responsive to the signal at four times the intermediate frequency for modulating an in-phase base-band signal and a quadrature-phase base-band signal to produce an intermediate frequency signal, wherein the quadrature modulator harmonic rejection mixer includes:
        a first circuit for generating multiple phases of a digital signal at the intermediate frequency responsive to the signal at four times the intermediate frequency, wherein the multiple phases of the digital signal at the intermediate frequency includes a first set of at least two respective phases out of phase by ninety degrees relative to a second set of at least two respective phases;
        a second circuit for combining the in-phase base-band signal and the first set of at least two respective phases of the digital signal at the intermediate frequency responsive to a first set of at least two respective current sink weightings to produce a first set of at least two respective intermediate frequency output signals;
        a third circuit for combining the quadrature-phase base-band signal and the second set of at least two respective phases of the digital signal as the intermediate frequency responsive to a second set of at least two respective current sink weightings to produce a second set of at least two respective intermediate frequency output signals; and
        a fourth circuit for combining the first set of at least two respective intermediate frequency output signals and the second set of at least two respective intermediate frequency output signals to produce the intermediate frequency signal;
    a filter responsive to the intermediate frequency signal for producing a filtered intermediate frequency signal; and
    an RF output offset phase-locked loop responsive to the filtered intermediate frequency signal and responsive to the signal at four times the intermediate frequency for producing an RF transmission signal;
    wherein the local oscillator includes a phase-locked loop having digital circuits for channel selection;

wherein the RF output offset phase-locked loop includes a voltage-controlled oscillator responsive to a frequency control signal for producing the RF transmission signal, an offset mixer for down-converting the RF transmission signal with the filtered intermediate frequency signal to produce a difference frequency signal, and a phase detector for comparing phase of the difference frequency signal with phase of the signal at four times the intermediate frequency to produce the frequency control signal.

21. A wireless communications transceiver circuit comprising:

a local oscillator including a channel-selecting voltage-controlled oscillator for producing a signal at a multiple of an intermediate frequency for transmission and for producing a receiver local oscillator signal;

a quadrature modulator responsive to the signal at the multiple of the intermediate frequency for modulating an in-phase base-band signal and a quadrature-phase base-band signal for producing an intermediate frequency signal, wherein the quadrature modulator harmonic rejection mixer includes;

a first circuit for generating multiple phases of a digital signal at the intermediate frequency responsive to the multiple of the intermediate frequency, wherein the multiple phases of the digital signal at the intermediate frequency includes a first set of at least two respective phases out of phase by ninety degrees relative to a second set of at least two respective phases;

a second circuit for combining the in-phase base-band signal and the first set of at least two respective phases of the digital signal at the intermediate frequency responsive to a first set of at least two respective current sink weightings to produce a first set of at least two respective intermediate frequency output signals;

a third circuit for combining the quadrature-phase base-band signal and the second set of at least two respective phases of the digital signal at the intermediate frequency responsive to a second set of at least two respective current sink weightings to produce a second set of at least two respective intermediate frequency output signals; and a fourth circuit for combining the first set of at least two respective intermediate frequency output signals and the second set of at least two respective intermediate frequency output signals to produce the intermediate frequency signal;

an RF output offset phase-locked loop responsive to the intermediate frequency signal and responsive to the signal at die multiple of the intermediate frequency for producing an RF transmission signal; and a direct conversion receiver responsive to the receiver local oscillator signal;

wherein the local oscillator includes a receiver local oscillator generator circuit for producing the receiver local oscillator signal responsive to channel selection by the channel-selecting voltage-controlled oscillator;

wherein the receiver local oscillator generator circuit includes a divider for dividing the frequency produced by the channel selection voltage-controlled oscillator by four, and a single sideband mixer responsive to the divider and the channel selection voltage control oscillator for scaling the frequency produced by the channel selection voltage control oscillator by a factor of five divided by four.

22. The wireless transceiver circuit as claimed in claim 21, wherein the receiver local oscillator generator circuit further includes a flip-flop for producing a signal at one-half of a frequency produced by the single sideband mixer and a multiplexer having a first input coupled to the single sideband mixer, a second input coupled to the flip-flop, and an output for providing the receiver local oscillator signal to the direct conversion receiver, and the multiplexer is responsive to a select signal for selecting either the frequency produced by the single sideband mixer or one-half of the frequency produced by the single sideband mixer to be the receiver local oscillator frequency signal.

23. A plural-band wireless communications transceiver circuit for EGSM and DCS or PCS operation comprising:

a local oscillator including a channel-selecting voltage-controlled oscillator for producing a signal at a multiple of an intermediate frequency for the transmitter, the intermediate frequency being switchable between EGSM operation and DCS or PCS operation;

a quadrature modulator harmonic rejection mixer responsive to the signal at the multiple of the intermediate frequency for modulating an in-phase base-band signal and a quadrature-phase base-band signal for producing an intermediate frequency signal, wherein the quadrature modulator harmonic rejection mixer includes:

a first circuit for generating multiple phases of a digital signal at the intermediate frequency responsive to the multiple of the intermediate frequency, wherein the multiple phases of the digital signal at the intermediate frequency includes a first set of at least two respective phases out of phase by ninety degrees relative to a second set of at least two respective phases;

a second circuit for combining the in-phase base-band signal and the first set of at least two respective phases of the digital signal at the intermediate frequency responsive to a first set of at least two respective current sink weightings to produce a first set of at least two respective intermediate frequency output signals;

a third circuit for combining the quadrature-phase base-band signal and the second set of at least two respective phases of the digital signal at the intermediate frequency responsive to a second set of at least two respective current sink weightings to produce a second set of at least two respective intermediate frequency output signals; and a fourth circuit for combining the first set of at least two respective intermediate frequency output signals and the second set of at least two respective intermediate frequency output signals to produce the intermediate frequency signal;

a switchable filter responsive to the intermediate frequency signal for producing a filtered intermediate frequency signal, the switchable filter being switchable between EGSM transmission and DCS or POS transmission;

an RF output offset phase-locked loop responsive to the filtered intermediate frequency signal and responsive to the signal at the multiple of the intermediate frequency for producing an RF transmission signal; and a direct conversion receiver responsive to the local oscillator signal for EGSM reception and DCS or PCS reception;

wherein the local oscillator includes a receiver local oscillator generator circuit for producing a receiver local oscillator signal responsive to channel selection by the channel-selecting voltage-controlled oscillator, wherein the receiver local oscillator generator circuit includes a divider for dividing the frequency produced by the channel selection voltage-controlled oscillator by four, and a single sideband mixer responsive to the divider and the channel selection voltage control oscillator for scaling the frequency produced by the channel selection voltage control oscillator by a factor of five divided by tour.

24. A plural-band wireless communications transceiver circuit for GSM and DCS or PCS operation comprising:
a local oscillator including a channel-selecting voltage controlled oscillator for producing a signal at a multiple of an intermediate frequency for the transmitter, the intermediate frequency being switchable between EGSM operation and DCS or PCS operation;
a quadrature modulator harmonic rejection mixer responsive to the signal at the multiple of the intermediate frequency for modulating an in-phase base-band signal and a quadrature-phase base-band signal for producing an intermediate frequency signal;
a switchable filter responsive to the intermediate frequency signal for producing a filtered intermediate frequency signal, the switchable filter being switchable between EGSM transmission and DCS or PCS transmission;
an RF output offset phase-locked loop responsive to the filtered intermediate frequency signal and responsive to the signal at the multiple of the intermediate frequency for producing an RF transmission signal; and
a direct conversion receiver responsive to the local oscillator signal for EGSM reception and DCS or PCS reception;
wherein the local oscillator includes a receiver local oscillator generator circuit for producing a receiver local oscillator signal responsive to channel selection by the channel-selecting voltage-controlled oscillator;
wherein the receiver local oscillator generator circuit further includes a flip-flop for producing a signal at one-half of the frequency produced by the single sideband mixer and a multiplexer having a first input coupled to the single sideband mixer, a second input coupled to the flip-flop, and an output for providing the receive local oscillator signal for the direct conversion receiver, and the multiplexer is responsive to a select signal for selecting either the frequency produced by the single sideband mixer or one-half of the frequency produced by the single sideband mixer to be the receiver local oscillator frequency signal.

25. A plural-band wireless communications transceiver circuit for EGSM operation and DCS or PCS operation comprising:
a channel-selecting voltage-controlled oscillator;
a two-step up-conversion plural-band wireless transmitter for EGSM transmission and DCS or PCS transmission upon a transmission channel selected by the channel-selecting voltage-controlled oscillator; and
a direct-conversion plural-band wireless receiver for EGSM reception and DCS or PCS reception of a reception channel selected by the channel-selecting voltage-controlled oscillator;
wherein the wireless transmitter includes:
a quadrature modulator harmonic rejection mixer for modulating an in-phase base-band signal and a quadrature-phase base-band signal for producing an intermediate frequency signal, wherein the quadrature modulator harmonic rejection mixer includes;
a first circuit for generating multiple phases of a digital signal at an intermediate frequency including a first set of at least two respective phases out of phase by ninety degrees relative to a second set of at least two respective phases;
a second circuit for combining the in-phase base-band signal and the first set of at least two respective phases of the digital signal at the intermediate frequency responsive to a first set of at least two respective current sink weightings to produce a first set of at least two respective intermediate frequency output signals;
a third circuit for combining the quadrature-phase base-band signal and the second set of at least two respective phases of the digital signal at the intermediate frequency responsive to a second set of at least two respective current sink weightings to produce a second set of at least two respective intermediate frequency output signals; and
a fourth circuit for combining the first set of at least two respective intermediate frequency output signals and the second set of at least two respective intermediate frequency output signals to produce the intermediate frequency signal;
a switchable filter responsive to the intermediate frequency signal for producing a filtered intermediate frequency signal, the switchable filter being switchable between EGSM transmission and DCS or PCS transmission, wherein the switchable filter is a third-order low pass filter; and
an RF output offset phase-locked loop responsive to the filtered intermediate frequency signal for producing an RF transmission signal.

26. A plural-band wireless communications transceiver circuit for EGSM operation and DCS or PCS operation comprising:
a channel-selecting voltage-controlled oscillator;
a two-step up-conversion plural-band wireless transmitter for EGSM transmission and DCS or PCS transmission upon a transmission channel selected by the channel-selecting voltage-controlled oscillator; and
a direct-conversion plural-band wireless receiver for EGSM reception and DCS or PCS reception of a reception channel selected by the channel-selecting voltage-controlled oscillator,
wherein the wireless transmitter includes:
a quadrature modulator harmonic rejection mixer for modulating an in-phase base-band signal and a quadrature-phase base-band signal for producing an intermediate frequency signal, wherein the quadrature modulator harmonic rejection mixer includes:
a first circuit for generating multiple phases of digital signal at an intermediate frequency including a first set of at least two respective phases out phase by ninety degrees relative to a second set of at least two respective phases;
a second circuit for combining the in-phase base-band signal and the first set of at least two respective phases of the digital signal at the intermediate frequency responsive to first set of at least two respective current sink weightings to produce a first set of at least two respective intermediate frequency output signals;
a third circuit for combining the quadrature-phase base-band signal and the second set of at least two respective phases of the digital signal at the intermediate frequency responsive to a second set of at least two respective current sink weightings to produce a second set of at least two respective intermediate frequency output signals; and a fourth circuit for combining the first set of at least two respective intermediate frequency output signals and the second set of at least two respective intermediate frequency output signals to produce the intermediate frequency signal;

a switchable filter responsive to the intermediate frequency signal for producing a filtered intermediate frequency signal, the switchable filter being switchable between EGSM transmission and DCS or PCS transmission, wherein the switchable filter is a fourth-order low pass filter; and an RF output offset phase-locked loop responsive to the filtered intermediate frequency signal for producing an RF transmission signal.

27. A plural-band wireless communications transceiver circuit for EGSM operation and DCS or PCS operation comprising:

a channel-selecting voltage-controlled oscillator;

a two-step up-conversion plural-band wireless transmitter for EGSM transmission and DCS or PCS transmission upon a transmission channel selected by the channel-selecting voltage-controlled oscillator; and a direct-conversion plural-band wireless receiver for EGSM reception and DCS or PCS reception of a reception channel selected by the channel-selecting voltage-controlled oscillator;

wherein the wireless transmitter includes:

a quadrature modulator harmonic rejection mixer for modulating an in-phase base-band signal and a quadrature-phase base-band signal for producing an intermediate frequency signal, wherein the quadrature modulator harmonic rejection mixer includes:

a first circuit for generating multiple phases of a digital signal at an intermediate frequency including a first set of at least two respective phases our of phase by ninety degrees relative to a second set of at least two respective phases; a second circuit for combining the in-phase base-band signal and the first set of at least two respective phases of the digital signal at the intermediate frequency responsive to a first set of at least two respective current sink weightings to produce a first set of at least two respective intermediate frequency output signals;

a third circuit for combining the quadrature-phase base-band signal and the second set of at least two respective phases of the digital signal at the intermediate frequency responsive to a second set of at least two respective current sink weightings to produce a second set of at least two respective intermediate frequency output signals; and a fourth circuit for combining the first set of at least two respective intermediate frequency output signals and the second set of at least two respective intermediate frequency output signals to produce the intermediate frequency signal;

a switchable filter responsive to the intermediate frequency signal for producing a filtered intermediate frequency signal, the switchable filter being switchable between EGSM transmission and DCS or PCS transmission; and an RF output offset phase-locked loop responsive to the filtered intermediate frequency signal for producing an RF transmission signal;

wherein for EGSM and DCS or PCS operation, the local oscillator produces a signal at a frequency of four times a local oscillator frequency of the quadrature modulator harmonic rejection mixer, the quadrature modulator harmonic rejection mixer divides the frequency of the signal produced by the channel-selecting voltage-controlled oscillator by four, and the RF offset phase-lock loop is responsive to the signal produced by the channel-selecting voltage-controlled oscillator to produce an RF transmission frequency at five-fourths of the frequency of the signal produced by the channel-selecting voltage-controlled oscillator.

28. A plural-band wireless communications transceiver circuit for EGSM operation and DCS or PCS operation comprising:

a channel-selecting voltage-controlled oscillator;

a two-step up-conversion plural-band wireless transmitter for EGSM transmission and DCS or PCS transmission upon a transmission channel selected by the channel-selecting voltage-controlled oscillator; and a direct-conversion plural-band wireless receiver for EGSM reception and DCS or PCS reception of a reception channel selected by the channel-selecting voltage-controlled oscillator;

wherein the wireless transmitter includes:

a quadrature modulator harmonic rejection mixer for modulating an in-phase base-hand signal and a quadrature-phase base-band signal for producing an intermediate frequency signal, wherein the quadrature modulator harmonic rejection mixer includes:

a first circuit for generating multiple phases of a digital signal at an intermediate frequency including a first set of at least two respective phases out of phase by ninety degrees relative to a second set of at least two respective phases;

a second circuit for combining the in-phase base-band signal and the first set of at least two respective phases of the digital signal at the intermediate frequency responsive to a first set of at least two respective current sink weightings to produce a first set of at least two respective intermediate frequency output signals;

a third circuit for combining to quadrature-phase base-band signal and the second set of at least two respective phases of the digital signal at the intermediate frequency responsive to a second set of at least two respective current sink weightings to produce a second set of at least two respective intermediate frequency output signals; and a fourth circuit for combining the first set of at least two respective intermediate frequency output signals and the second set of at least two respective intermediate frequency output signals to produce the intermediate frequency signal;

a switchable filter responsive to the intermediate frequency signal for producing a filtered intermediate frequency signal, the switchable filter being switchable between EGSM transmission and DCS or PCS transmission; and an RF output offset phase-locked loop responsive to the filtered intermediate frequency signal for producing an RF transmission signal, wherein the wireless transceiver includes a receiver local oscillator generator circuit and a direct conversion receiver.

29. The wireless transceiver as claimed in claim 28, wherein the receiver local oscillator generator circuit includes a divider for dividing the frequency produced by the channel selection voltage-controlled oscillator by four, and a single sideband mixer responsive to the divider and the channel selection voltage control oscillator for scaling the frequency produced by the channel selection voltage control oscillator by a factor of five divided by four.

30. The wireless transceiver circuit as claimed in claim 29, wherein the receive local oscillator generator circuit further includes a flip-flop for producing a signal at one-half of the frequency produced by the single sideband mixer and a multiplexer having a first input coupled to the single sideband mixer, a second input coupled to the flip-flop, and an output for providing the receiver local oscillator signal for the direct conversion receiver, and the multiplexer is responsive to a select signal for selecting either the frequency produced by the single sideband mixer or one-half of the frequency produced by the single sideband mixer to be the receiver local oscillator frequency signal.

31. A radio frequency (RF) circuit comprising:
a quadrature modulator for modulating in-phase base-band signal and a quadrature-phase base-band signal responsive to an intermediate frequency (IF) signal to produce a modulated IF signal, the quadrature modulator including:
a first circuit for generating multiple phases of a digital signal at an IF responsive to the IF signal, wherein the multiple phases of the digital signal at the IF includes a first set of at least two respective phases out of phase by ninety degrees relative to a second set of at least two respective phases;
a second circuit for combining the in-phase base-band signal and the first set of at least two respective phases of the digital signal at the IF responsive to a first set of at least two respective current sink weightings to produce a first set of at least two respective IF output signals;
a third circuit for combining the quadrature-phase base-band signal and the second set of at least two respective phases of the digital signal at the IF responsive to a second set of at least two respective current sink weightings to produce a second set of at least two respective IF output signals; and
a fourth circuit for combining the first set of at least two respective IF output signals and the second set of at least two respective IF output signals to produce the modulated IF signal.

32. An RF circuit according to claim 31
wherein the first circuit further comprises a shift register counter,
wherein the second circuit further comprises a first set of at least two multipliers,
wherein the third circuit further comprises a second set of at least two multipliers, and
wherein the fourth circuit further comprises an adder.

33. An RF circuit according co claim 32
wherein the shift register counter further comprises at least two gated latch cells,
wherein the first set of at least two multipliers further comprise a first set of at least two Gilbert cells,
wherein the second set of at least two multipliers further comprise a second set of at least two Gilbert cells, and
wherein the adder further comprises a parallel connection coupled to a pair of respective load resistors.

34. An RF circuit according to claim 33,
wherein the shift register counter further comprises four gated latch cells providing four respective phases of the digital signal at the IF,
wherein the first set of at least two multipliers further comprise three Gilbert cells, and
wherein the second set of at least two multipliers further comprise three Gilbert cells.

35. An RF circuit according to claim 34,
wherein the four gated latch cells are cascaded in series from first to fourth, wherein a logic inversion occurs in a feedback path between outputs of the fourth gated larch cell in the series and inputs of the first gated latch cell in the series,
wherein a first pair of gated latch cells further comprises a first master-slave delay flip flop, and
wherein a second pair of gated latch cells further comprises a second master-slave delay. flip-flop.

36. An RF circuit according to claim 31 further comprising:
a local oscillator for generating the IF signal; and
a transmit phase-locked loop for generating a modulated RF transmission signal responsive to the IF signal and the modulated IF signal.

37. An RF circuit according to claim 36 further comprising:
a filter responsive far generating a filtered IF signal responsive to the modulated IF signal, wherein the transmit phase-locked loop generates the RF transmission signal responsive to the IF signal and the filtered IF signal.

38. An RF circuit according to claim 31 further comprising:
a quadrature demodulator for demodulating a modulated RF reception signal responsive to the IF signal to produce a received in-phase base-band signal and a received quadrature-phase base-band signal.

* * * * *